(12) United States Patent
Park

(10) Patent No.: US 7,871,885 B2
(45) Date of Patent: Jan. 18, 2011

(54) MANUFACTURING METHOD OF FLASH MEMORY DEVICE

(75) Inventor: Jin-Ha Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 397 days.

(21) Appl. No.: 11/943,114

(22) Filed: Nov. 20, 2007

(65) Prior Publication Data

US 2008/0211008 A1    Sep. 4, 2008

(30) Foreign Application Priority Data

Dec. 20, 2006  (KR) .................. 10-2006-0131443
Dec. 27, 2006  (KR) .................. 10-2006-0135571
Dec. 29, 2006  (KR) .................. 10-2006-0137287

(51) Int. Cl.
*H01L 21/336*    (2006.01)

(52) U.S. Cl. .................. 438/257; 438/211; 257/314; 257/900; 257/E21.422; 257/E21.64; 257/E29.129

(58) Field of Classification Search .................. 438/201, 438/211, 218, 219, 229, 257, 275, 279, 283, 438/294, 295, 299, 300; 257/314, 758, 759, 257/760, 900, E21.422, E21.64, E29.3, E29.255, 257/E29.129, E29.128, E27.06
See application file for complete search history.

(56) References Cited

U.S. PATENT DOCUMENTS

| | | | |
|---|---|---|---|
| 6,610,571 B1 | 8/2003 | Chen et al. | |
| 2002/0100930 A1* | 8/2002 | Yaegashi | 257/315 |
| 2002/0192915 A1 | 12/2002 | Wada et al. | |
| 2003/0216004 A1* | 11/2003 | Jeong et al. | 438/279 |
| 2005/0048754 A1 | 3/2005 | Yeh et al. | |
| 2006/0163678 A1* | 7/2006 | Anezaki | 257/411 |

FOREIGN PATENT DOCUMENTS

| | | |
|---|---|---|
| CN | 1591823 | 3/2005 |
| JP | 2000174270 | 6/2000 |

* cited by examiner

*Primary Examiner*—Minh-Loan T Tran
*Assistant Examiner*—Leslie Pilar Cruz
(74) *Attorney, Agent, or Firm*—Sherr & Vaughn, PLLC

(57) ABSTRACT

Embodiments relate to a manufacturing method of a flash memory device which improves electrical characteristics by reducing or preventing void generation. A manufacturing method of a flash memory device according to embodiments includes forming a plurality of gate patterns over a semiconductor substrate including a tunnel oxide layer, a floating gate, a dielectric layer, and a control gate. A spacer layer may be formed as a compound insulating layer structure over the side wall of the gate pattern. A source/drain area may be formed over the semiconductor substrate at both sides of the control gate. An insulating layer located at the outermost of the spacer layer may be removed. A contact hole may be formed between the gate patterns by forming and patterning the interlayer insulating layer. A contact plug may be formed in the contact hole.

14 Claims, 10 Drawing Sheets

MANUFACTURING METHOD OF FLASH MEMORY DEVICE

The present application claims priority under 35 U.S.C. 119 to Korean Patent Application No. 10-2006-0137287, filed on Dec. 29, 2006, Korean Patent Application No. 10-2006-0131443, filed on Dec. 20, 2006, and Korean Patent Application No. 10-2006-0135571, filed on Dec. 27, 2006, all of which are hereby incorporated by reference in their entirety.

BACKGROUND

A flash memory device is a kind of a programmable ROM capable of writing, erasing, and reading information. A flash memory device forms a unit string configured of serially connected cell transistors. The memory cells may be the NAND type, which are suitable for high integration since the unit strings are connected between bit lines and ground lines in parallel. The memory cells may be the NOR type, which are suitable for high-speed operations since the cell transistors are connected between bit lines and ground lines in parallel.

Since a NOR type flash memory device can be read at a high speed, it may be used for booting a cellular phone. Since the NAND type flash memory device has a lower read speed but has a faster write speed, it may be suitable for storing data where compactness is a relatively larger consideration.

Flash memory devices may be classified as a stack gate type and a split gate type according to the structure of a unit cell. Flash memory devices may also be classified as a floating gate device and a silicon-oxide-nitride-oxide-silicon (SONOS) device according to the configuration of a charge storing layer. A floating gate device usually includes a floating gate formed of a poly silicon, surrounded by an insulator around it's circumference. To store and erase data, charge is injected into and emitted from the floating gate by a channel hot carrier injection or a follower-Nordheim tunneling.

Figure 1:
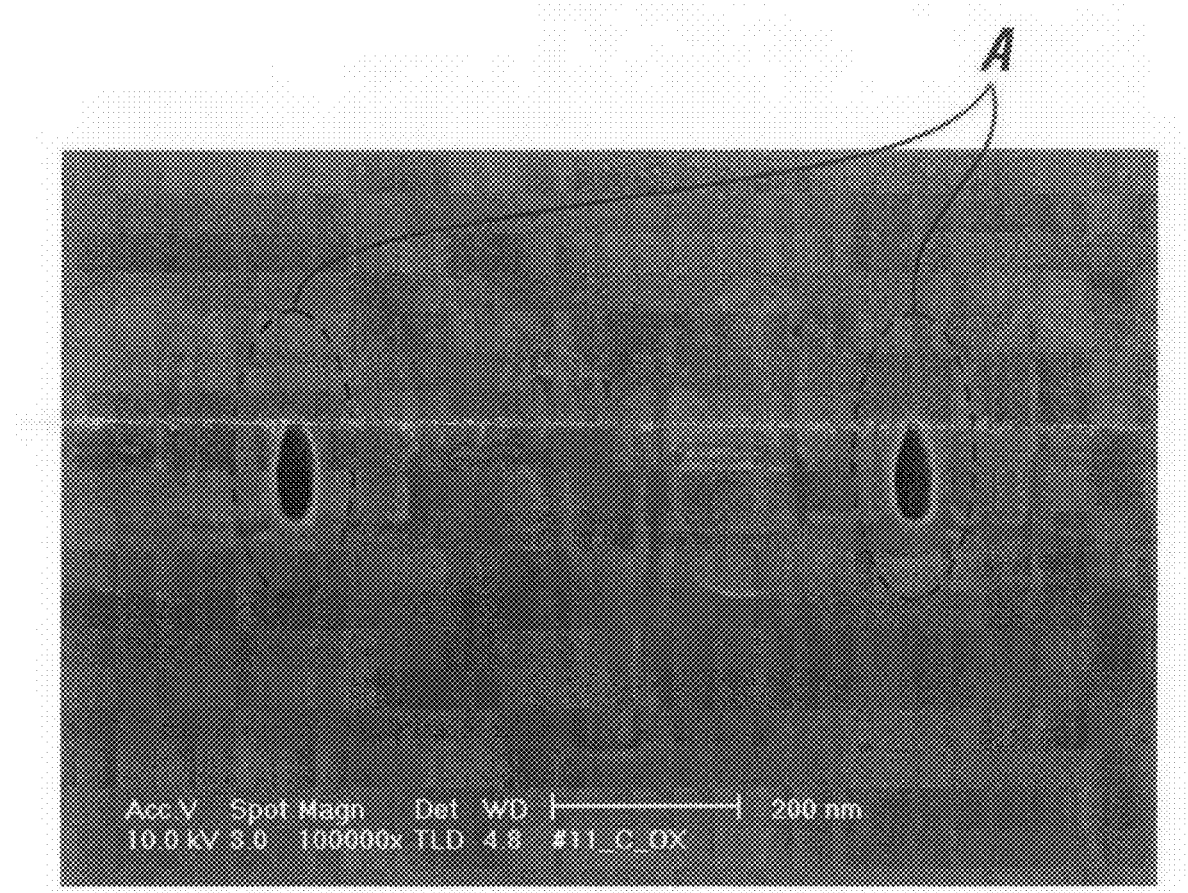

However, as semiconductor devices tend towards higher integration, smaller design rules must be used for flash memory cells. Accordingly, a 0.13μ flash memory device may have sufficient space for forming a contact in a unit cell. As the size of the unit cell is reduced, the available gap between gate areas forming the unit cell becomes so narrow that a void A is generated after a deposition process for an interlayer dielectric layer as shown in FIG. 1.

The void A changes the characteristics of each cell, creating problems in that the word lines operate differently. To subsequently form a contact, if a metal such as tungsten W, etc., is injected, the tungsten may be diffused toward the void A, causing a contact to contact bridge phenomenon. The tungsten may thereby become bridged with other contacts. The gate formed in the word line may not operate correctly. This causes an error in the cell operation, which significantly degrades the reliability and yield of the flash memory device.

SUMMARY

Embodiments relate to a manufacturing method of a flash memory device which improves electrical characteristics by reducing or preventing void generation. A manufacturing method of a flash memory device according to embodiments includes forming a plurality of gate patterns over a semiconductor substrate including a tunnel oxide layer, a floating gate, a dielectric layer, and a control gate. A spacer layer may be formed as a compound insulating layer structure over the side wall of the gate pattern. A source/drain area may be formed over the semiconductor substrate at both sides of the control gate. An insulating layer located at the outermost of the spacer layer may be removed. A contact hole may be formed between the gate patterns by forming and patterning the interlayer insulating layer. A contact plug may be formed in the contact hole.

DRAWINGS

FIG. 1 shows voids generated in a manufacturing process of a flash memory device.

Example FIGS. 2a to 2h are process cross-sectional views for explaining a manufacturing method of a flash memory device according to embodiments.

Figure 3:
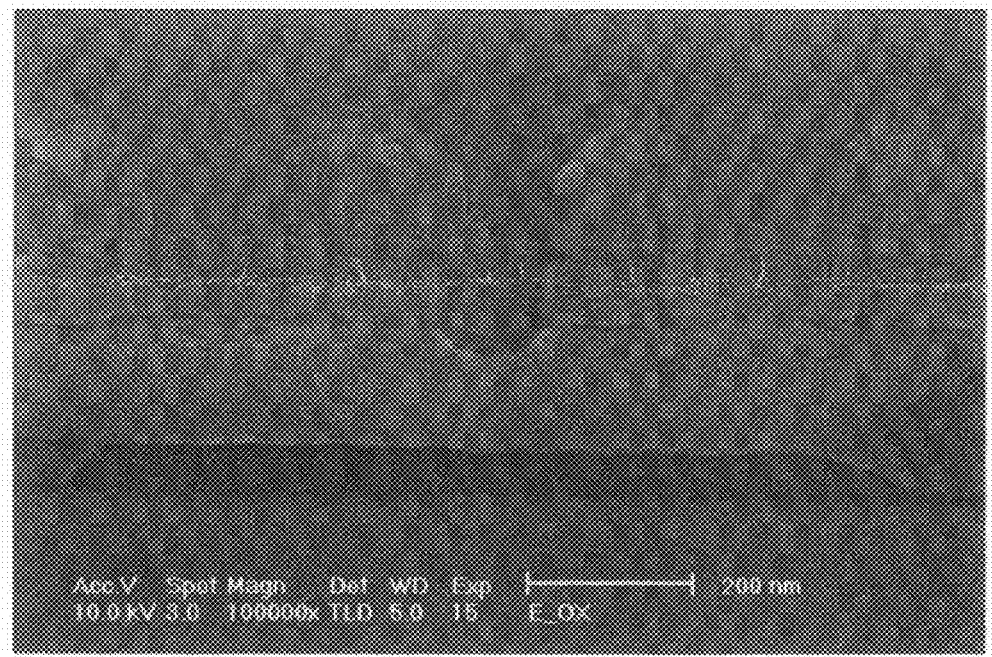

Example FIG. 3 is a view showing an effect of a manufacturing method of a flash memory device according to embodiments.

Example FIGS. 4a to 4f are cross-sectional views showing a manufacturing process of a flash memory device according to embodiments.

Example FIGS. 5a to 5d are cross-sectional views showing a manufacturing process of a flash memory device according to embodiments.

DESCRIPTION

Example FIGS. 2a to 2h are process cross-sectional views for explaining a manufacturing method of a flash memory device according to embodiments.

Figure 2A:
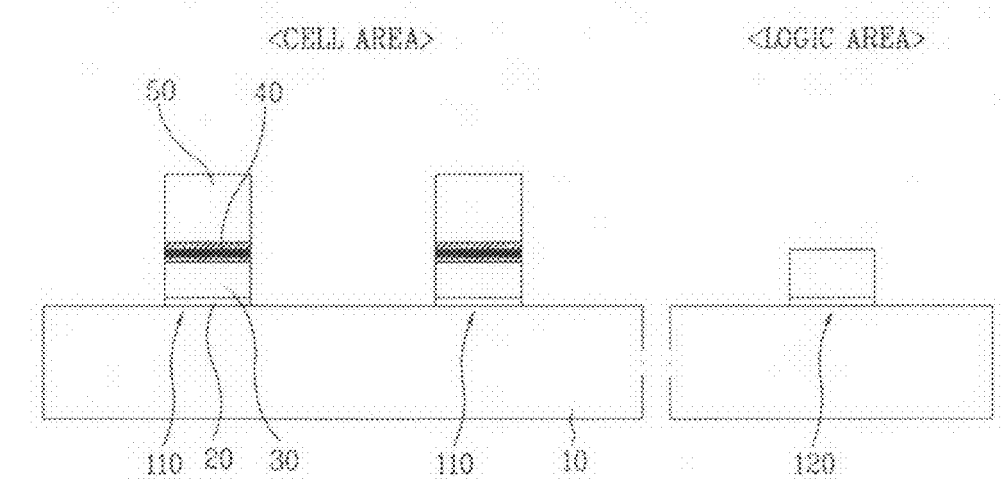

As shown in example FIG. 2a, the manufacturing method of the flash memory device according to embodiments forms a plurality of gate patterns 110 and 120 in a cell area and a logic area, respectively, over a semiconductor substrate 10. Herein, the semiconductor substrate 10 has been already subjected to a device isolating layer forming process, a well forming process, and a channel forming process.

A plurality of gate patterns 110 in a cell area are formed in the same shape. They may include a tunnel oxide layer 20, a floating gate 30 storing data, a control gate 50 functioning as a word line, and a dielectric layer 40 which isolates the control gate 50 from the floating gate 30. Herein, the dielectric layer 40 may be formed of an oxide-nitride-oxide (ONO) structure, for example. After forming the plurality of gate patterns 110 and 120, a low-concentration impurity ion is implanted in the semiconductor substrate 10 not covered by the gate patterns 110 and 120, to form a lightly doped drain (LDD) area.

Figure 2B:
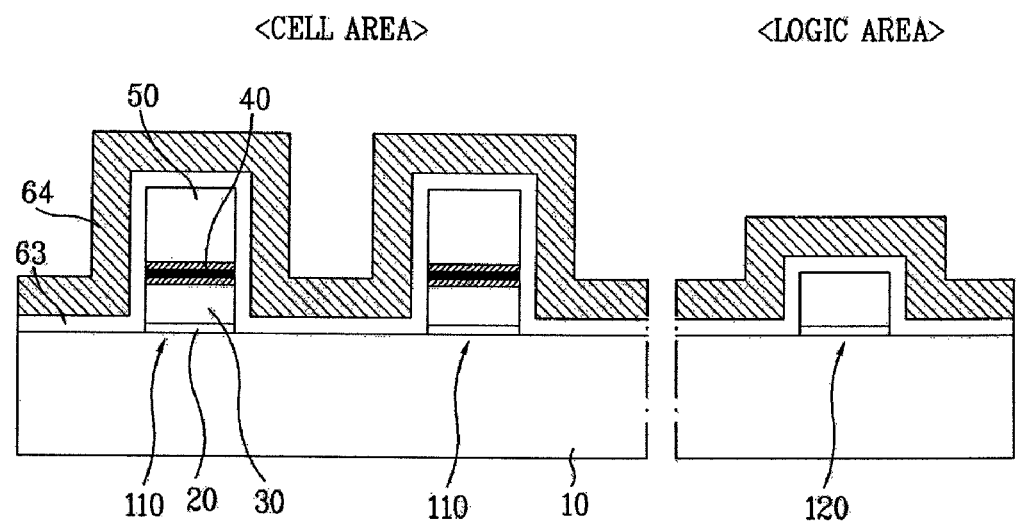

As shown in example FIG. 2b, an oxide layer 63 and a nitride layer 64 are sequentially formed over the semiconductor substrate 10 including the plurality of gate patterns 110 and 120. Herein, the oxide layer 63, which may be formed of a tetraethyl orthosilicate, may be formed at a thickness of 150 Å to 300 Å. Nitride layer 64, which may be formed of silicon nitride (SiN), may be formed over the oxide layer 63 at a thickness of 600 Å to 1100 Å.

Figure 2C:
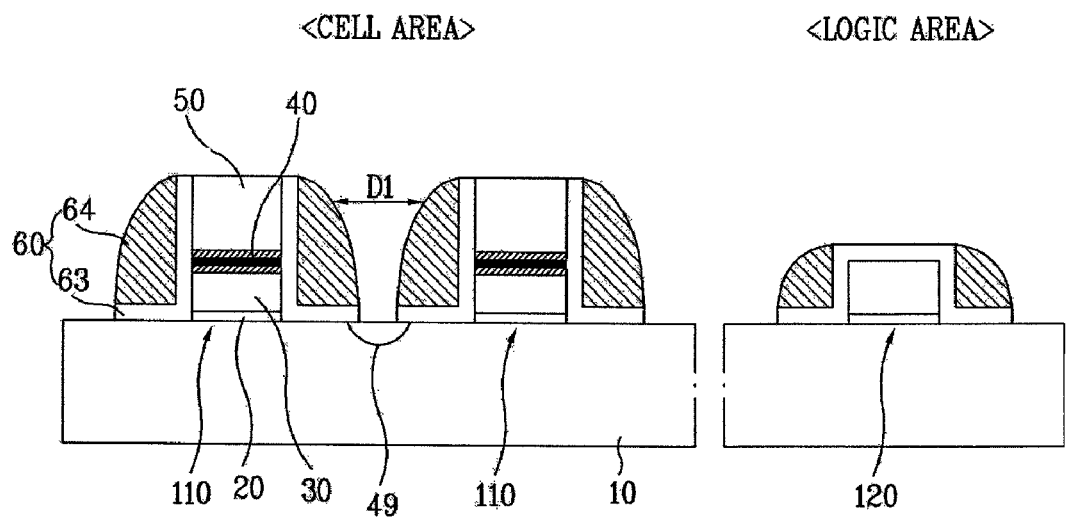

As above, after the oxide layer 63 and the nitride layer 64 are sequentially formed, as shown in example FIG. 2c, a reactive ion etching (RIE) may be performed on the oxide layer 63 and the nitride layer 64 at both sides of the gate patterns 110 and 120 to form the spacer layer 60. A first gap area D1, which is an empty space between the gate patterns 110, is formed and at the same time. The surface of the semiconductor substrate 10 in the first gap area D1 is exposed. An ion implant process may be performed using the spacer layer 60 as an ion implant mask to form a source/drain area 49, which is a high-concentration impurity area of the semiconductor substrate 10. The spacer layer 60 is formed to isolate and protect the gate pattern 110 and may have a rounded shape due to the reactive ion etching (RIE).

Figure 2D:
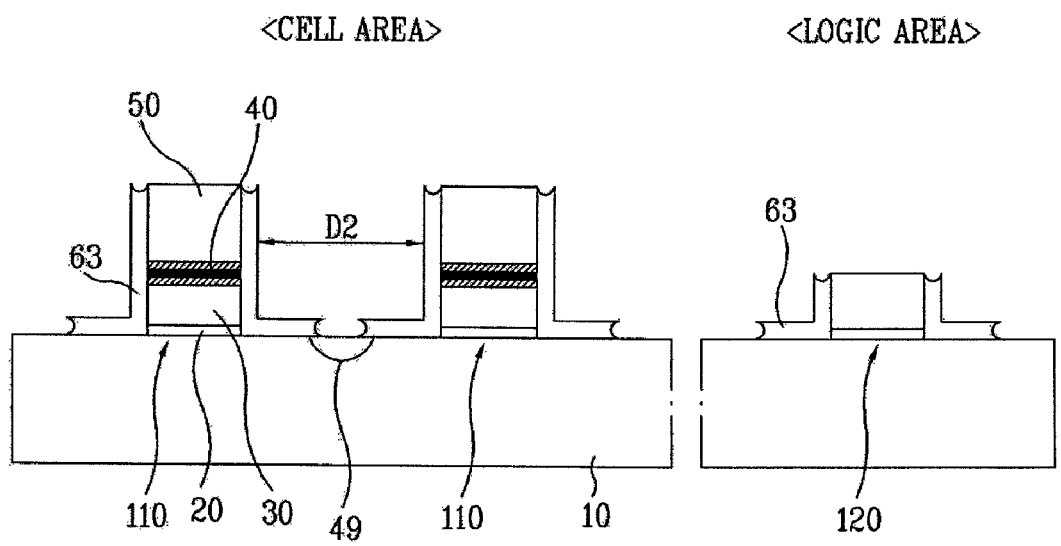
Figure 2E:
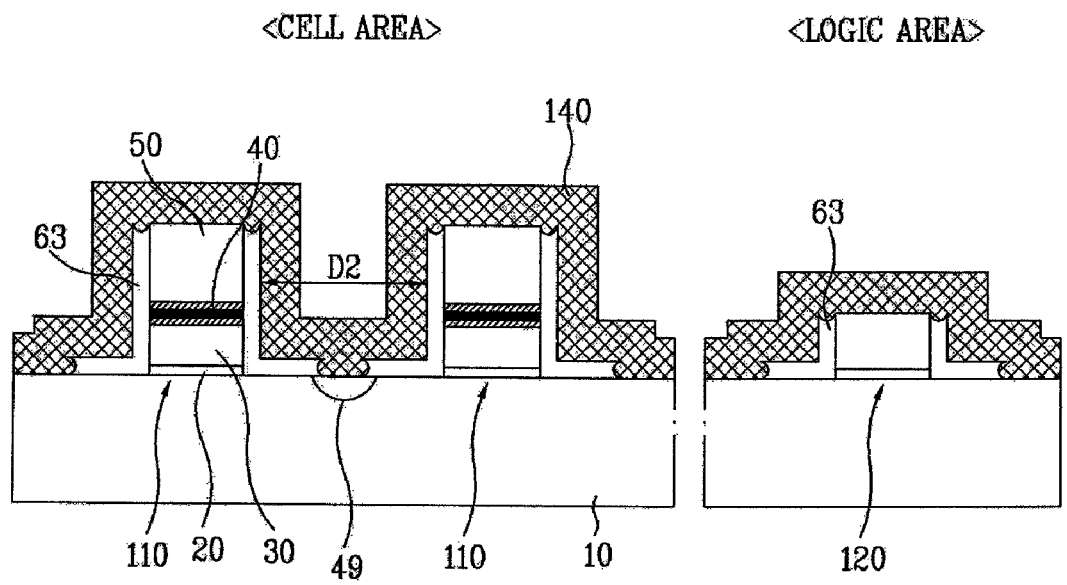

As shown in example FIG. 2d, the nitride layer 64 of the spacer layer 60 may be removed using an etchant which is mixture of phosphoric acid ($H_3PO_4$) of 80% to 90%, which may particularly be 85%, and deionized water so that the oxide layer 63 remains. The reason for removing the nitride 64, as shown in example FIG. 2c, is that the first gap area D1 was narrow where the spacer layer 60 was formed. A void may be generated in such a narrow first gap area D1 during a later process forming an interlayer dielectric layer 200. To prevent this, the nitride layer 64 of the spacer layer 60 is removed. A second gap area D2 has a sufficient space between the gate patterns 110 to prevent void generation when forming the interlayer dielectric layer 200. The width of the second gap area D2 may be approximately 90 nm to 150 nm, for example.

Thereafter, if the nitride layer 64 of the sidewall spacer layer 60 is removed using the etchant, the oxide layer 63 over the upper side of the gate pattern 110 is also removed, exposing a control gate 50 of the gate pattern 110. The gate pattern may be damaged in a wet process of a subsequently performed salicide processes so that one side of the unwanted gate patterns 110 and 120 is salicided. To help prevent this, as shown in example FIG. 2e, after removing the nitride layer 64 of the spacer layer 60, a salicide blocking barrier 140 is deposited over the semiconductor substrate 10.

The salicide blocking barrier 140 is a SiN film deposited with a uniform step coverage over the semiconductor substrate 10 including the gate patterns 110 and 120 on which the nitride layer 64 is removed, using a low-pressure CVD (LPCVD) method. The SiN film may be formed with a thickness of approximately 100 Å to 300 Å.

Figure 2F:
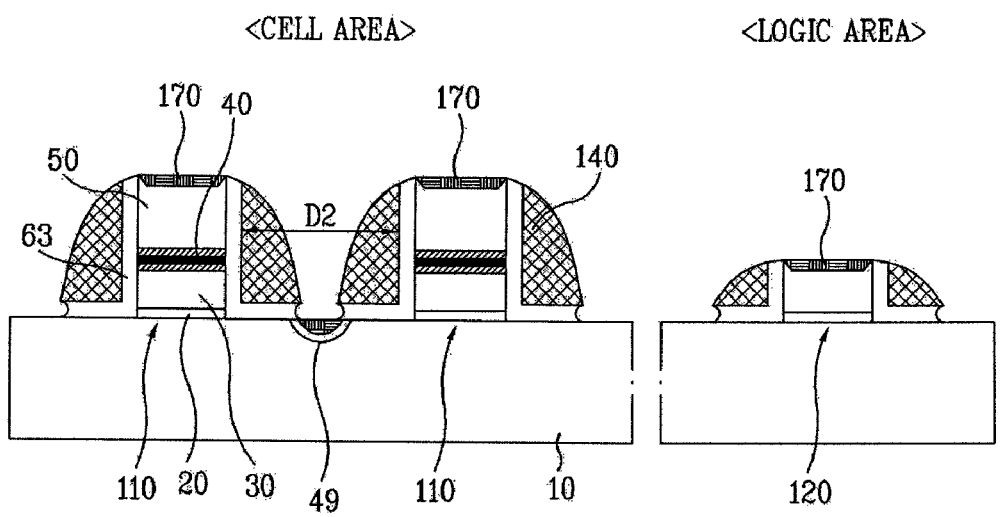

After forming the salicide blocking barrier 140, as shown in example FIG. 2f, a non-salicide RIE is performed in order to remove the salicide blocking barrier 140 in an area where the salicide process is performed, so that the salicide blocking barrier 140 of the area implanted with dopant including the plurality of source/drain areas 49 of the semiconductor substrate 10 and the upper side of the gate patterns 110 and 120 can be removed. Therefore, although the salicide blocking barrier 140 remains only the sidewall of the gate patterns 110 and 120 so that the sidewalls of the gate patterns 110 and 120 are protected, after performing the wet process removing the oxide which remains in the area, a metal layer with high melting point formed of Co etc is deposited in the area on which the salicide process is performed and a rapid thermal process is performed thereon so that a plurality of salicide layers 170 can be formed over the upper of gate patterns 110 and 120 and the upper side of the plurality of source/drain areas 49 of the semiconductor substrate 10.

Figure 2G:
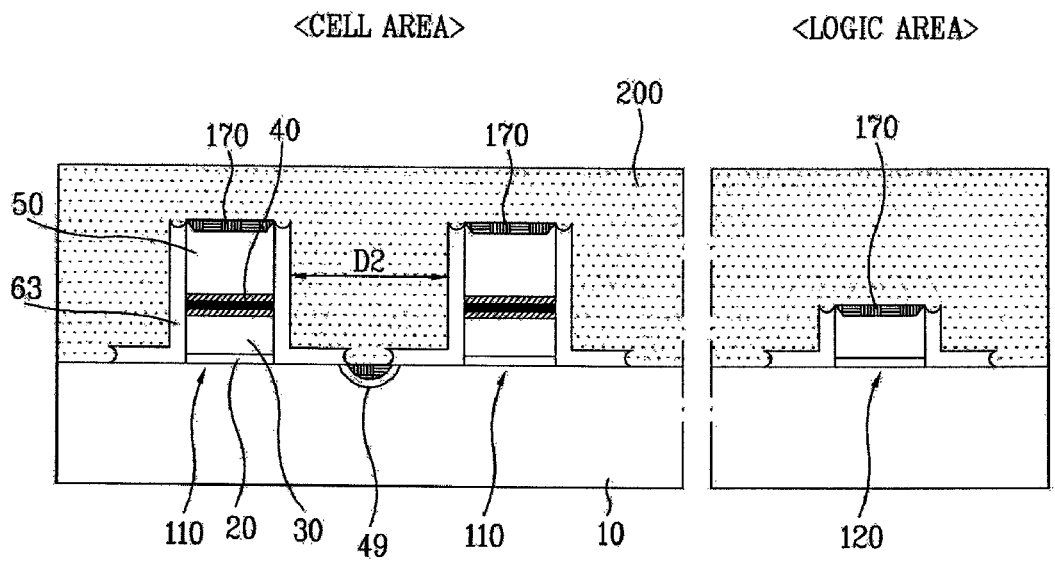

After performing the salicide process, as shown in example FIG. 2g, the interlayer dielectric layer 200 may be formed over the semiconductor substrate 10 including between the gate patterns 110 securing the second gap area D2. The interlayer dielectric layer 200 may be formed using a phosphorus silicate glass (PSG), a boro-phosphorus silicate glass (BPSG), an undoped silicate glass (USG), or a PETEOS as a pre metal dielectric (PMD). The second gap area D2 has sufficient width so that a void is not generated when forming the interlayer dielectric layer 200. As a result, as shown in example FIG. 3, the interlayer dielectric layer 200 can be provided without generating a void.

Figure 2H:
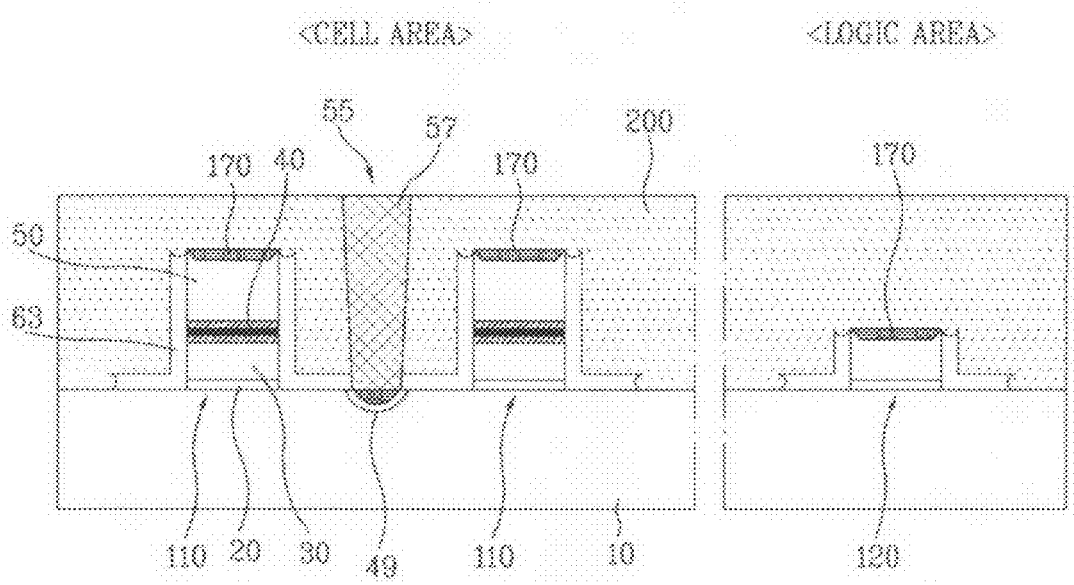

As shown in example FIG. 2h, if a contact hole 55 is formed between the gate patterns 110, and a drain contact 57 is formed by being filling the hole 55 with a conductive material such as tungsten (W), the void is not generated in the interlayer dielectric layer 200. Therefore, when the tungsten is deposited in the contact hole 55, a diffusion phenomenon due to a void is not generated, thereby enabling the flash memory device to operate normally.

Example FIGS. 4a to 4f are cross-sectional views showing a manufacturing process of a flash memory device according to embodiments. A manufacturing process of a flash memory device according to embodiments shown in example FIG. 4a to 4f may be different in the constitution of spacer layer 60, etc, but the other remaining processes may be the same as the first embodiment. Accordingly, the same reference numerals refer to the same parts throughout the drawings and the description thereof will be omitted.

Figure 4A:
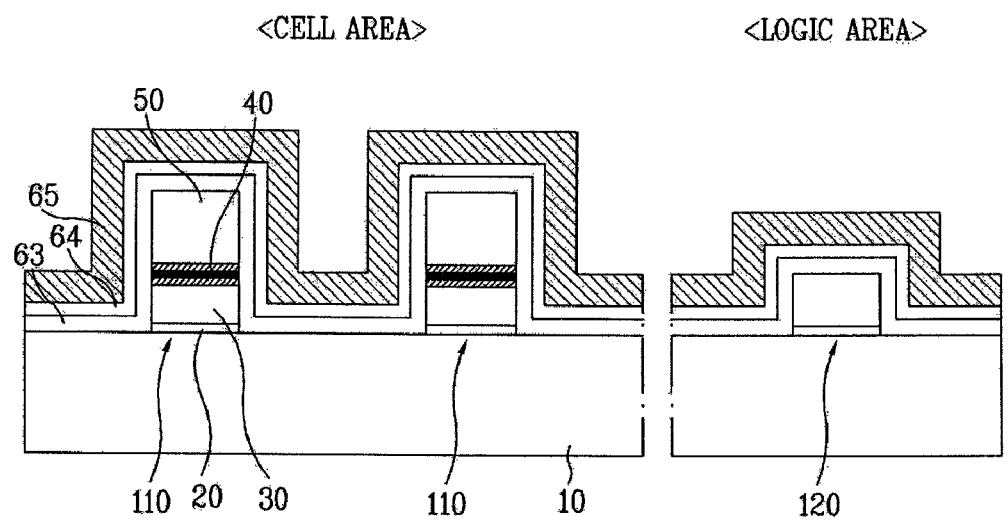

First, as shown in example FIG. 4a, a first oxide layer 63, a nitride layer 64, and a second oxide layer 65 are sequentially deposited over a semiconductor substrate 10 including the plurality of gate patterns 110 and 120 for the overall upper unit cell.

Herein, the first oxide layer 63, which may be formed of a tetraethyl orthosilicate (TEOS), may be formed at a thickness of approximately 150 Å to 300 Å. A nitride layer 64, which may be formed of silicon nitride (SiN), may be formed at a thickness of approximately 100 Å to 300 Å. A second oxide layer 65, which may be formed of TEOS, may be formed at a thickness of approximately 500 Å to 800 Å.

Figure 4B:
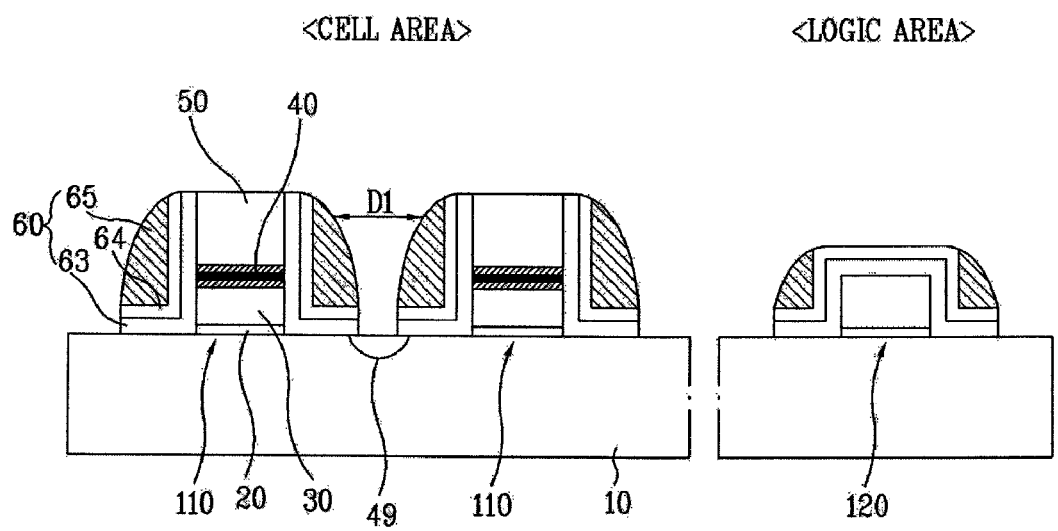

As shown in example FIG. 4b, if the first oxide layer 63, the nitride layer 64, and the second oxide layer 65 may be etched by a reactive ion etching (RIE) method to form spacer layer 60 at both sides of the gate pattern 110 and 120. The first gap area D1, which is an empty space between the gate patterns 110, is formed and at the same time. The surface of the semiconductor substrate 10 in the first gap area D1 is exposed. The nitride layer 64 may be used as an etch stop layer so that the etch process may be terminated at the nitride layer 64. The spacer layer 60 is formed to isolate and protect the gate pattern 110. It may be rounded by the reactive ion etching (RIE). Both ends of the first oxide layer 63, the nitride layer 64, and the second oxide layer 65 may be exposed at the edges. An ion implant process may be performed using the spacer layer 60 as the ion implant mask to form the source/drain areas 49, which are the high-concentration impurity areas of the semiconductor substrate 10.

Figure 4C:
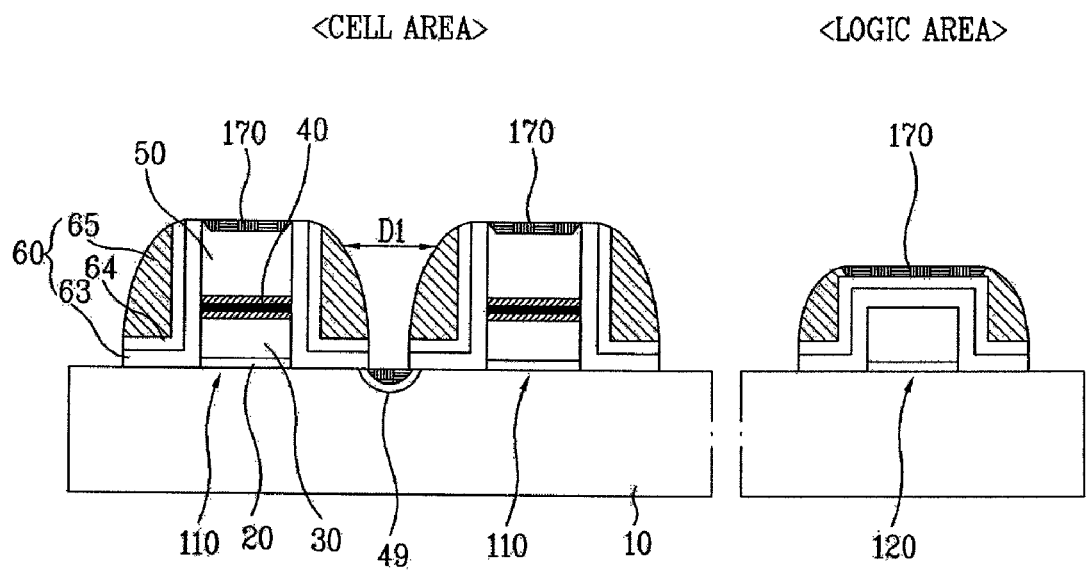

As shown in example FIG. 4c, a conductive material such as cobalt may be formed and patterned over the surface of semiconductor substrate 10 including the spacer layer 60 to form the salicide layer 170 in the control gate 50 and the source/drain area 49 of the gate area. The salicide layer 170 can be formed to improve an electrical contact performance of the gate area and the source/drain areas 49 and the wiring to be formed later.

Figure 4D:
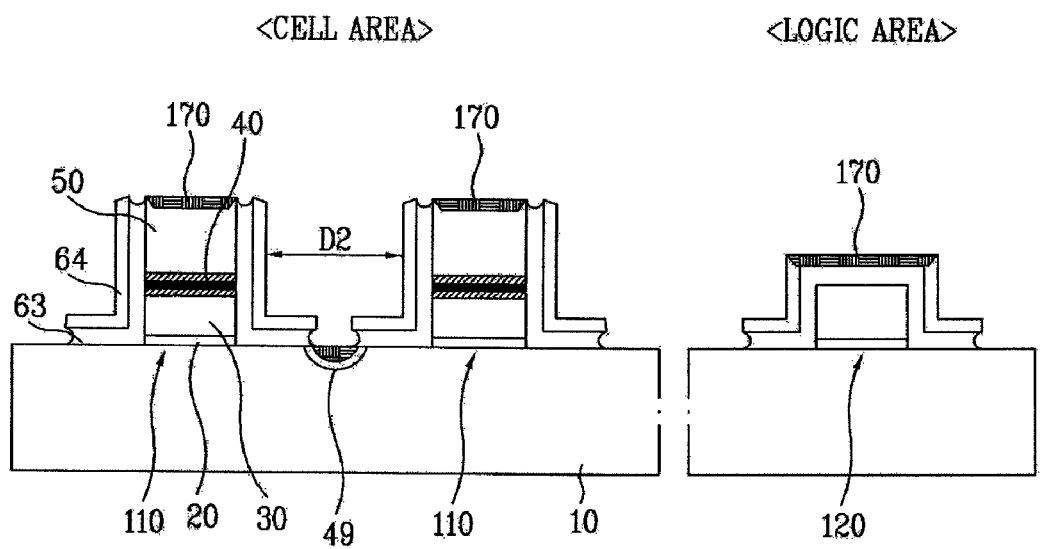

As shown in example FIG. 4d, the semiconductor substrate 10 is dipped into etchant such as hydrogen fluoride (HF) to remove the second oxide layer 65 which is the outermost layer of the spacer layer 60. At this time, a mixing ratio of hydrogen fluoride (HF) and water ($H_2O$) may be in the range of approximately 1:100 to 1:200 and a process time may be in the range of approximately 100 seconds to 140 seconds. The second oxide layer 65 of the spacer layer 60 is removed so that the width between the gate patterns 110 is approximately doubled. Since the width between the gate patterns 110 is greatly increased, when the interlayer dielectric layer 200 later fills the gap, a void is not generated between the gate patterns 110.

Figure 4E:
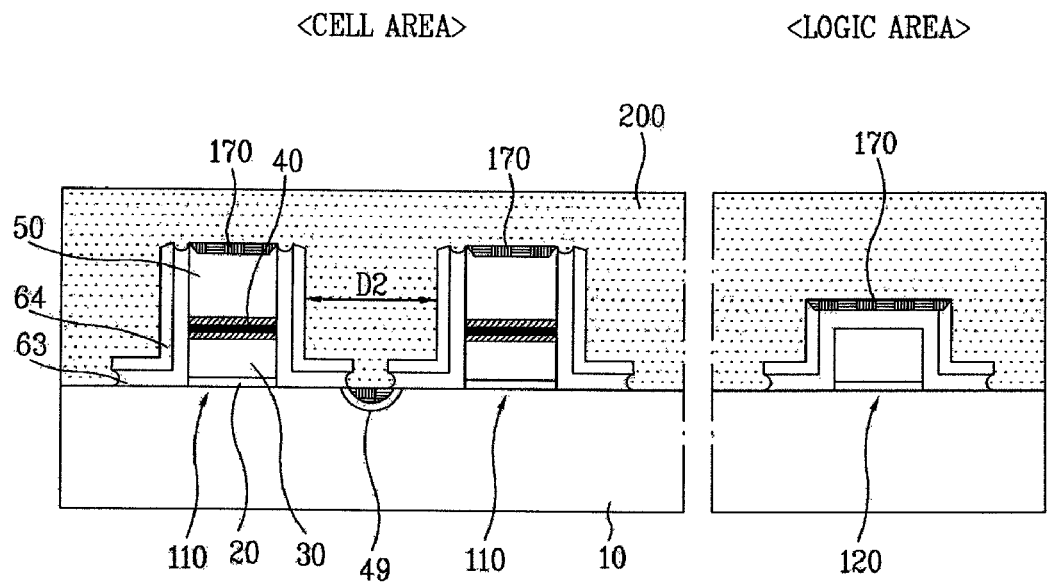

As shown in example FIG. 4e, the interlayer dielectric layer 200 may be formed over the semiconductor substrate 10 including the gate patterns 110 and 120 using a dielectric material such as a phosphorus silicate glass (PSG), a borophosphorus silicate glass (BPSG), an undoped silicate glass, or a PETEOS.

Figure 4F:
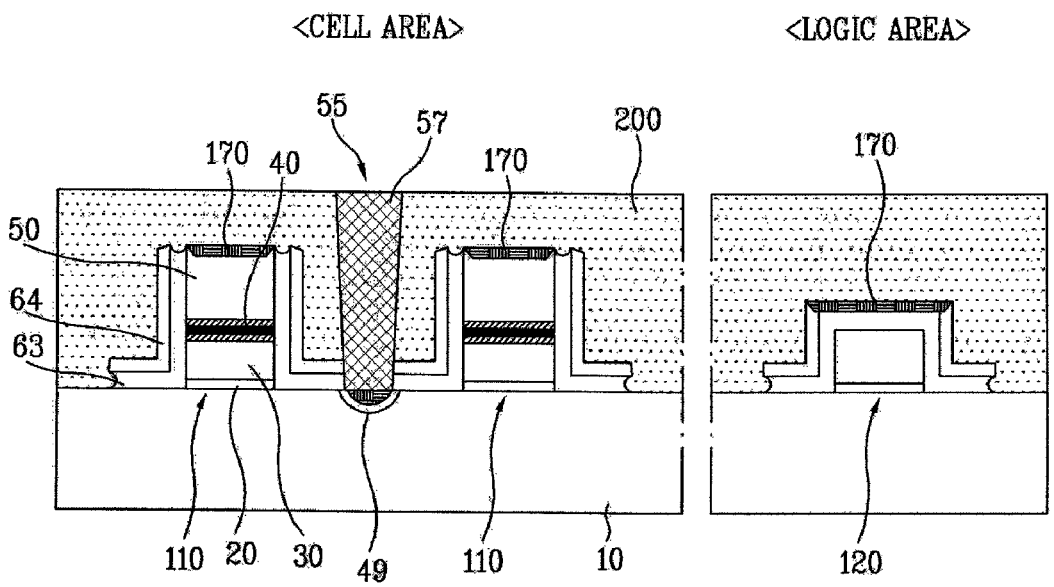

As shown in example FIG. 4f, the interlayer dielectric layer 200 is selectively patterned to expose the silicide layer 51 over the source/drain areas 49 formed over the semiconductor substrate 10 between the gate patterns 110 so that a contact hole 55 is formed. A drain contact 57 may formed by filling the hole 57 with a conductive material such as tungsten (W).

The manufacturing method according to embodiments does not generate voids in the interlayer dielectric layer 200. When the tungsten fills in the contact hole 55, it is not subjected to the diffusion phenomenon due to the void. The flash memory device will therefore operate normally.

Example FIGS. 5a to 5d are cross-sectional views showing a manufacturing process of a flash memory device according to embodiments. The manufacturing process of the flash memory device according to embodiments shown in example FIGS. 5a to 5d may be the same as other embodiments, excepting that the scum formed in the first gap area D1 and the salicide layer is produced. Accordingly, the same reference numerals refer to the same parts throughout the drawings and the description thereof will be omitted.

Figure 5A:
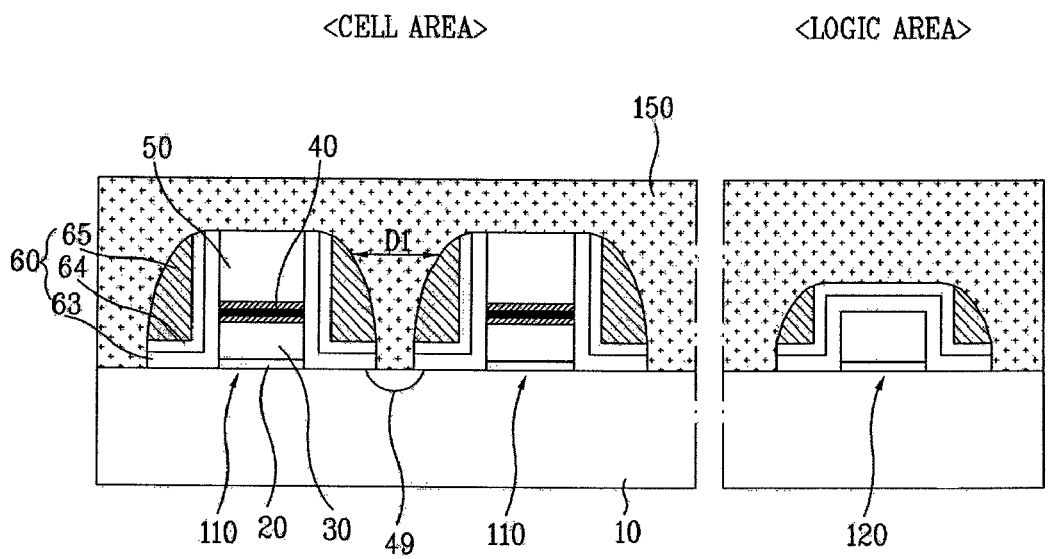
Figure 5B:
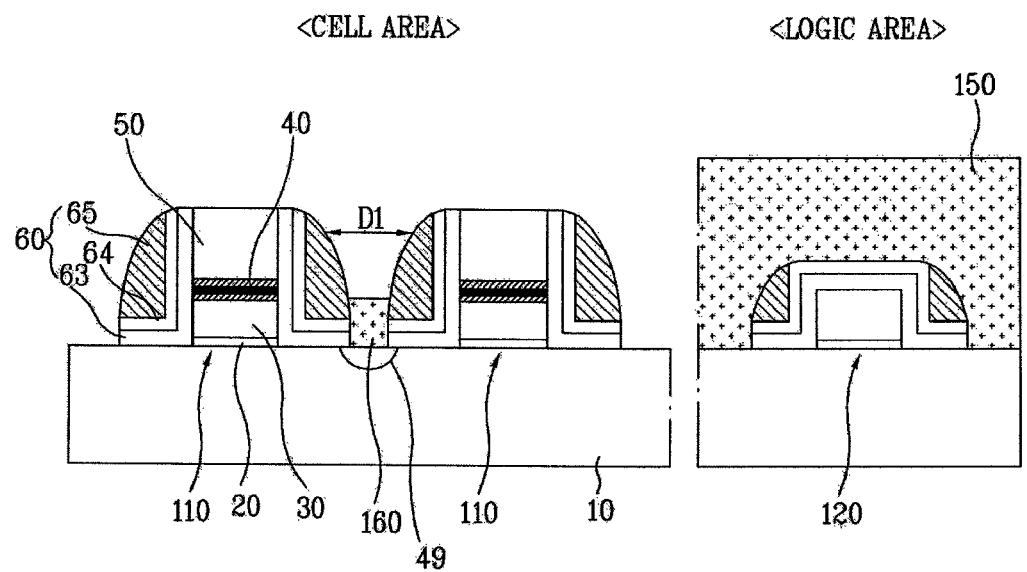

As shown in example FIG. 5a, after a photoresist film is coated over the upper surface of the semiconductor substrate 10, it is subjected to an exposure and development processes so that the photoresist pattern 150 is formed only in the logic area. At this time, as shown in example FIG. 5b, the photoresist film of the first gap area D1 in the cell area is not exposed and developed but remains as it is so that scum 160 is formed in the first gap area D1.

The scum 160 remains since the photoresist film is not sufficiently exposed in the development process and thus, is not removed in the subsequent photoresist removing step. As above, the scum 160 is formed in the first gap area D1 so that the under cut phenomenon is not generated in the first oxide layer 63 in the subsequent etch process of the second oxide layer 65.

Figure 5C:
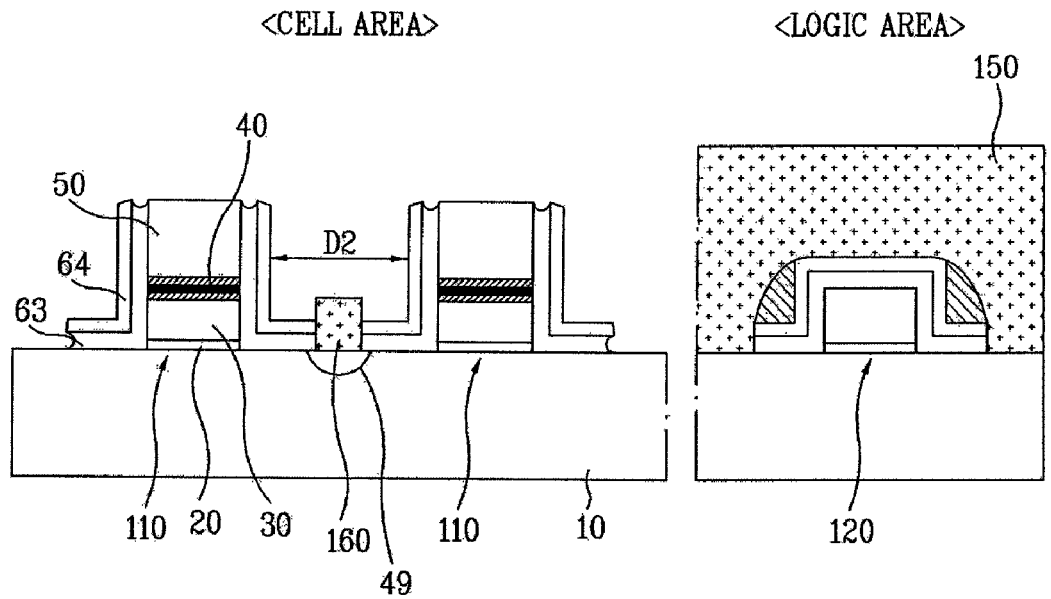

As shown in example FIG. 5c, the outermost second oxide layer 65 of the spacer layer 60 is removed by means of the wet etch process using BHF solution. In the etch process of the second oxide layer 65, the edge of the first oxide layer 63 formed of the same material is etched together so that the spacer layer 60 and the second cap area D2 are formed.

The second oxide layer 65, which may be thickly formed as compared to the first oxide layer 63 and the nitride layer 64, is removed so that the second gap area D2 is a sufficient width. As a result, after the spacer layer 60 is formed, the first gap area D1 in which the contact hole 55 is to be formed is not narrow so that void generation can be prevented when forming the interlayer dielectric layer 200. The gap between the gate patterns 110 may be reduced by the thickness of the second oxide layer 65 to be removed so that a higher degree of device integration may be achieved. Even when the profile of the spacer layer 60 is changed, the overall operation of the flash memory device is not influenced.

The scum 160 is formed between the gate patterns 110 so that when in the wet etch process for removing the second oxide layer 65, the scum 160 serves as the barrier of the first oxide layer 63 to prevent the etch of the first oxide layer 63 by means of the etchant. Accordingly, the under cut phenomenon is prevented at the edge of the first oxide layer 63. This helps prevent bridge formation in the subsequent contact hole 55 forming process.

Figure 5D:
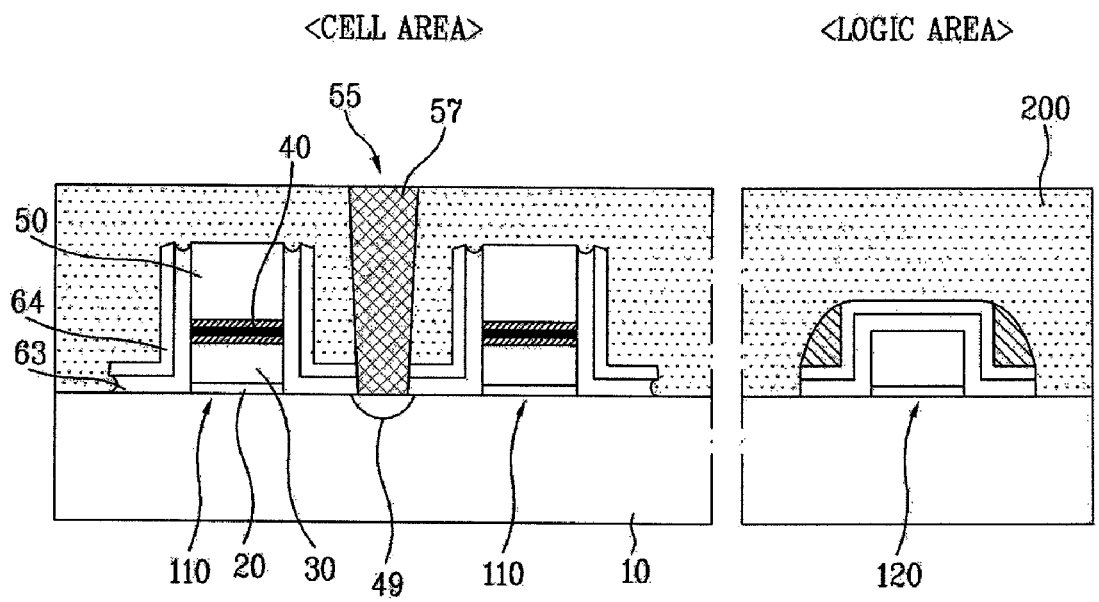

As shown in example FIG. 5d, after removing the photoresist pattern 150 and the scum 160 of the logic area, the interlayer dielectric layer 200 is formed over the upper of the semiconductor substrate 10. After a contact hole 55 is formed between the gate patterns 110, tungsten (W), for example, may be deposited to form the drain contact 57.

Since voids in the interlayer dielectric layer 200 are not generated, the diffusion phenomenon due to the voids is not generated when depositing the tungsten, thereby enabling the flash memory device to operate normally. The under cut phenomenon is not generated in the first oxide layer 63 of the gate pattern 110 so that when the drain contact 57 is formed, the effects of a device-to-device bridge due to the diffusion of the buried tungsten can be removed.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a plurality of gate patterns, comprising a tunnel oxide layer, a floating gate, a dielectric layer, and a control gate, over a semiconductor substrate;
    forming a compound spacer layer having a stack comprising a first oxide layer, a nitride layer, and a second oxide layer over a side wall of the gate pattern;
    forming at least one source/drain area in the semiconductor substrate at both sides of the gate pattern;
    coating a photoresist film over the semiconductor substrate;
    forming a scum between the gate patterns by exposing and developing the photoresist film;
    removing the second oxide layer;
    removing the scum;
    forming an interlayer insulating layer over the semiconductor substrate;
    forming a contact hole between the gate patterns by patterning the interlayer insulating layer; and
    forming a contact plug in the contact hole.

2. The method of claim 1, wherein the interlayer dielectric layer is a pre-metal dielectric and is formed using one selected from a group consisting of a phosphorus silicate glass, a boro-phosphorus silicate glass, an undoped silicate glass, and a PETEOS.

3. The method of claim 1, comprising forming a lightly doped drain area by implanting a low-concentration impurity ion into the semiconductor substrate using the gate pattern.

4. The method of claim 1, wherein the gap between the gate patterns is doubled due to the removal of the outermost insulating layer.

5. The method of claim 1, wherein said removing the second oxide layer uses a wet etch process.

6. The method of claim 5, wherein an etchant in the wet etch process is one of BHF and hydrogen fluoride.

7. The method of claim 6, wherein the wet etch process includes a mixing ratio of hydrogen fluoride and water in the range of 1:100 to 1:200 and a process time in the range of 100 seconds to 140 seconds.

8. The method of claim 1, wherein the first oxide layer of the spacer layer is formed of tetraethyl orthosilicate, the nitride layer is formed of SiN, and the second oxide layer is formed of tetraethyl orthosilicate.

9. The method of claim 8, further comprising forming a salicide layer in the gate pattern and the source/drain areas.

10. The method of claim 9, wherein the salicide layer is exposed over the source/drain areas through the contact hole.

11. A method comprising:
   forming a plurality of gate patterns, comprising a tunnel oxide layer, a floating gate, a dielectric layer, and a control gate, over a semiconductor substrate;
   forming a compound spacer layer having a stack comprising an oxide layer and a nitride layer over a side wall of the gate pattern;
   forming at least one source/drain area in the semiconductor substrate at both sides of the gate pattern;
   removing the nitride layer and the oxide layer on a upper side of the gate patterns;
   depositing a salicide blocking barrier layer over the semiconductor substrate including the spacer layer where the nitride layer is removed;
   removing the salicide blocking barrier layer over a upper surface of the gate pattern and over the source/drain area by performing a non-salicide reactive ion etch for removing the salicide blocking barrier layer in an area where the salicide process is performed;
   forming a plurality of salicide layers using a metal layer with high melting point by depositing the metal layer over the area where the salicide process is performed, and performing a rapid thermal annealing process;
   forming an interlayer dielectric layer over the semiconductor substrate over which the gate pattern and the salicide blocking barrier layer remains;
   forming a contact hole between the gate patterns by forming and patterning an interlayer insulating layer over the semiconductor substrate; and
   forming a contact plug in the contact hole.

12. The method of claim 11, wherein the nitride layer is removed using etchant which is mixture of 80% to 90% phosphoric acid ($H_3PO_4$), and 10% to 20% deionized water.

13. The method of claim 11, wherein the salicide blocking barrier layer is a SiN film deposited with an uniform step coverage using a low-pressure chemical vapor deposition method and is formed with a thickness of 100 Å to 300 Å.

14. The method of claim 13, wherein the width of the gap area between the gate patterns formed with the salicide blocking barrier layer is 90 nm to 150 nm.

* * * * *